United States Patent
Gruner et al.

(10) Patent No.: US 10,162,267 B2
(45) Date of Patent: Dec. 25, 2018

(54) PROJECTION EXPOSURE APPARATUS INCLUDING MECHANISM TO REDUCE INFLUENCE OF PRESSURE FLUCTUATIONS

(71) Applicant: Carl Zeiss SMT GmbH, Oberkochen (DE)

(72) Inventors: Toralf Gruner, Aalen-Hofen (DE); Sascha Bleidistel, Aalen (DE); Alexander Wolf, Oberkochen (DE); Joachim Hartjes, Aalen (DE); Markus Schwab, Aalen (DE); Markus Hauf, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 162 days.

(21) Appl. No.: 14/674,800

(22) Filed: Mar. 31, 2015

(65) Prior Publication Data

US 2015/0316854 A1 Nov. 5, 2015

Related U.S. Application Data

(63) Continuation of application No. PCT/EP2013/069575, filed on Sep. 20, 2013.
(Continued)

(30) Foreign Application Priority Data

Oct. 30, 2012 (DE) .................. 10 2012 219 806

(51) Int. Cl.
 *G03B 27/42* (2006.01)
 *G03F 7/20* (2006.01)
 *G03F 1/62* (2012.01)

(52) U.S. Cl.
 CPC .............. *G03F 7/7015* (2013.01); *G03F 1/62* (2013.01); *G03F 7/709* (2013.01);
(Continued)

(58) Field of Classification Search
 CPC .. G10K 11/16; G10K 11/1788; G10K 11/172; G10K 11/002; G10K 2210/3211;
(Continued)

(56) References Cited

U.S. PATENT DOCUMENTS 5,822,133 A  10/1998 Mizuno et al.
5,877,843 A   3/1999 Takagi et al.
(Continued)

FOREIGN PATENT DOCUMENTS

EP    2 068 349     6/2009
JP    H06-275494    9/1994
(Continued)

OTHER PUBLICATIONS

International Search Report and Written Opinion for corresponding PCT Appl No. PCT/EP2013/069575, dated Dec. 17, 2013.
(Continued)

*Primary Examiner* — Mesfin Asfaw
(74) *Attorney, Agent, or Firm* — Fish & Richardson P.C.

(57) ABSTRACT

The invention relates to a projection exposure apparatus for semiconductor lithography, comprising an illumination system for illuminating a mask arranged on a movable mask stage, and comprising a projection lens for imaging the mask onto a semiconductor substrate, wherein at least one means is present for at least partly decoupling at least parts of the illumination system and/or of the projection lens from the influence of pressure fluctuations in the medium surrounding the projection lens or the illuminated system, the pressure fluctuations being attributed to movements of the mask stage during the operation of the apparatus.

31 Claims, 7 Drawing Sheets

Related U.S. Application Data

Figure 1:
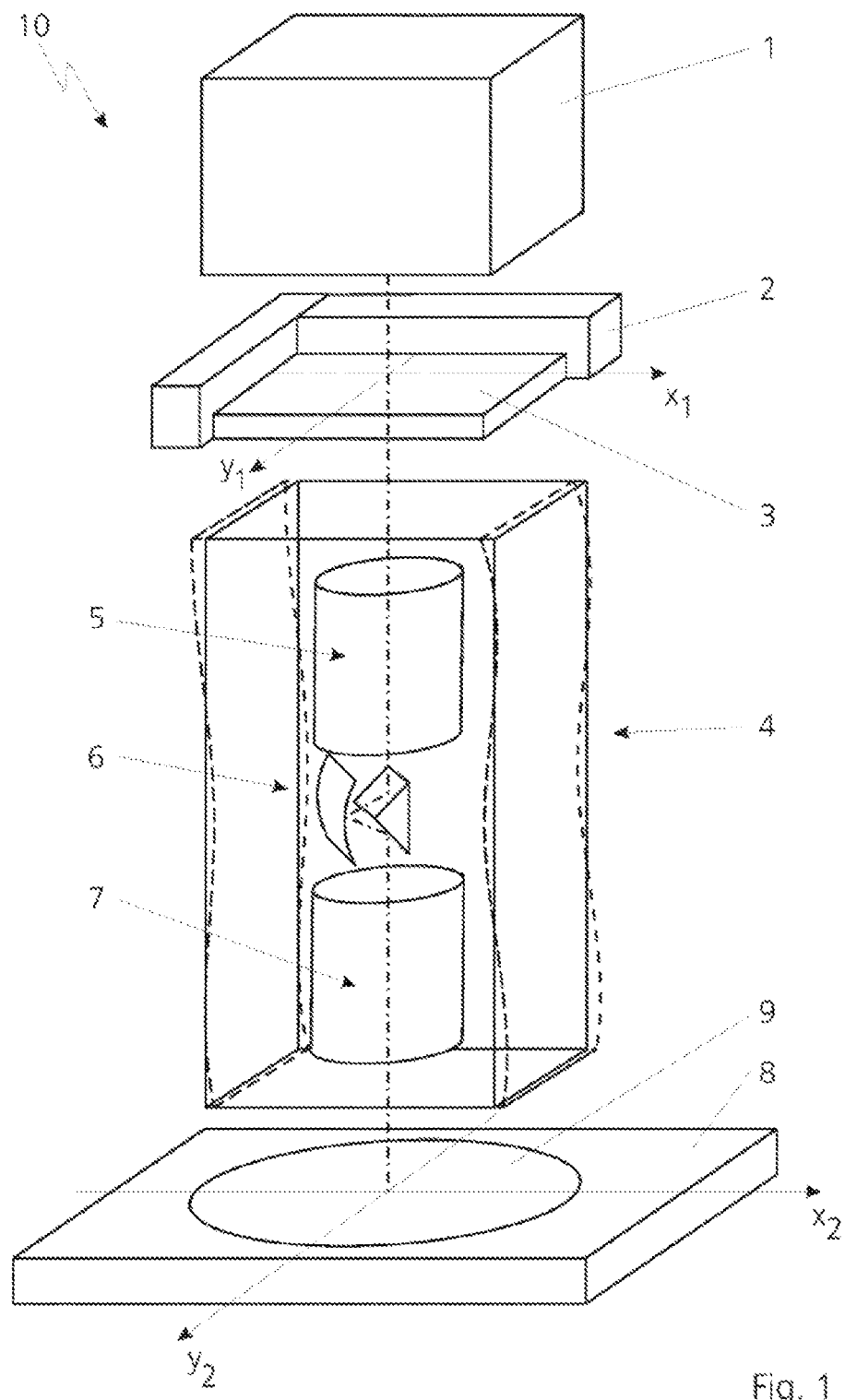

(60) Provisional application No. 61/720,079, filed on Oct. 30, 2012.

(52) U.S. Cl.
CPC ...... G03F 7/70825 (2013.01); G03F 7/70866 (2013.01); G03F 7/70883 (2013.01)

(58) Field of Classification Search
CPC .......... G10K 2210/32271; G03F 7/709; G03F 7/70833; G03F 7/20; G03F 7/70; G02B 7/00

See application file for complete search history.

(56) References Cited

U.S. PATENT DOCUMENTS

| | | | |
|---|---|---|---|
| 6,197,454 B1 | 3/2001 | Yan | |
| 6,727,981 B2* | 4/2004 | Taniuchi | G03B 27/42 355/30 |
| 6,961,113 B1* | 11/2005 | Hayashi | G03F 7/70883 355/30 |
| 8,310,651 B2 | 11/2012 | Hempenius et al. | |
| 9,378,722 B2 | 6/2016 | Butler et al. | |
| 2001/0026355 A1 | 10/2001 | Aoki et al. | |
| 2002/0057422 A1* | 5/2002 | Arakawa | G03F 7/70525 355/30 |
| 2003/0020888 A1* | 1/2003 | Tanaka | G03F 7/70058 355/30 |
| 2007/0146656 A1 | 6/2007 | Van Empel | |
| 2008/0170303 A1* | 7/2008 | Bieg | G02B 7/005 359/811 |
| 2008/0259299 A1* | 10/2008 | Geerke | G03F 7/709 355/53 |
| 2009/0161085 A1 | 6/2009 | Butler et al. | |
| 2009/0195760 A1* | 8/2009 | Hempenius | G03F 7/70825 355/18 |
| 2009/0195763 A1 | 8/2009 | Butler et al. | |
| 2009/0218511 A1 | 9/2009 | Tanaka | |
| 2009/0316129 A1 | 12/2009 | Butler et al. | |
| 2009/0323043 A1* | 12/2009 | Dieckmann | G03F 7/70191 355/71 |

FOREIGN PATENT DOCUMENTS

| | | |
|---|---|---|
| JP | H09-082625 | 3/1997 |
| JP | H09-106944 | 4/1997 |
| JP | 2003-347194 | 12/2003 |
| JP | 2009-141349 | 6/2009 |
| JP | 2009-152597 | 7/2009 |
| JP | 2009-182326 | 8/2009 |

OTHER PUBLICATIONS

German Office Action, with translation thereof, for corresponding DE Appl No. 10 2012 219 806.7, dated Jun. 5, 2013.

Japanese Office Action, with translation thereof, for corresponding Appl No. 2015-540078, dated Aug. 2, 2017.

Japanese Office Action, with translation thereof, for corresponding Appl No. 2015-540078, dated Aug. 1, 2018.

* cited by examiner

PROJECTION EXPOSURE APPARATUS INCLUDING MECHANISM TO REDUCE INFLUENCE OF PRESSURE FLUCTUATIONS

CROSS-REFERENCE TO RELATED APPLICATIONS

The present application is a continuation of, and claims benefit under 35 USC 120 to, international application PCT/EP2013/069575, filed Sep. 20, 2013, which claims benefit under 35 USC 119 of German Application No. 10 2012 219 806.7, filed Oct. 30, 2012. International application PCT/EP2013/069575 also claims priority under 35 USC 119(e) to U.S. Provisional Application No. 61/720,079, filed Oct. 30, 2012. The entire contents of these applications are incorporated by reference herein.

The invention relates to a mechanism for reducing the influence of pressure fluctuations in a projection exposure apparatus for lithographically producing structures on a semiconductor substrate comprising an illumination system, a mask stage, a projection lens and a wafer stage.

A projection exposure apparatus is used to produce micro- and nanostructures generally on a wafer-type substrate composed of a semiconductor material, the term wafer being used synonymously here. For this purpose, the wafer, which is typically provided with a photosensitive layer, is irradiated in a targeted manner with an electromagnetic radiation that is optically modulated by a mask introduced into the optical beam path. The mask can be held by a mask stage, and the wafer typically by a wafer stage, during the exposure process.

A projection exposure apparatus comprises an illumination system for conditioning the electromagnetic radiation from a radiation source, and a projection lens used for optically imaging the electromagnetic field of the mask plane onto the semiconductor substrate.

A significant parameter in the lithographic process is the optical imaging quality of the projection exposure apparatus, since the quality of the micro- and nanostructures produced in the wafer is greatly influenced by the optical imaging that occurs. In order to obtain a high-quality optical imaging, however, it is necessary, in particular, also to comply with narrow tolerances. The tolerances generally relate both to the material properties and the geometrical properties of the individual optical components and to the positions thereof relative to one another. The individual optical components include, in particular, optical lens elements, mirrors and filters.

During a use of the projection exposure apparatus mechanical vibrations can be implicated in the system, wherein the optical imaging can be adversely influenced. In particular, the individual optical components and the superordinate assemblies can be moved by the mechanical vibrations and displaced relative to their ideal position. The situation can also occur in which the individual optical components are deformed on account of the mechanical vibration and, as a result, their optical properties are modulated in an undesired manner. The optical properties of the individual components and the superordinate assemblies thereof may also include, in particular, the influencing of the polarization of the electromagnetic radiation that passes through the projection exposure apparatus.

Modern projection exposure apparatuses operate in the so-called scan mode, wherein the mask and the semiconductor substrate are moved synchronously in accordance with the optical imaging scale of the projection lens. In order here to save time required for the movement, the mask and the wafer are in some instances also greatly accelerated. In the medium surrounding the mask and/or the wafer, such a movement can bring about a pressure fluctuation that can subsequently be transferred to the projection exposure apparatus. The manifestation of the influence of pressure fluctuations can thus also be intensified in projection exposure apparatuses which operate in the scan mode.

In general, the influence of pressure fluctuations on the optical imaging quality is dependent on a number of parameters, wherein, inter alia, the design of the projection exposure apparatus can also play a significant part. The direct effect of the pressure fluctuations on the projection exposure apparatus can be described by mechanical vibration mode, for example.

In the same way, the magnitude of the pressure fluctuations can also be dependent on numerous parameters. In particular, the diameter of the wafer can also have a comparatively high influence, since comparatively large accelerations can occur during the scanning process. By way of example, even wafers having a diameter of approximately 450 nm are intended to be able to be used in conjunction with high optical imaging quality.

The invention is based on the object of avoiding or reducing a mechanism for reducing the influence of pressure fluctuations on a projection exposure apparatus. The intention is thereby to obtain an optimization of the optical imaging quality during the lithographic exposure.

This object is achieved according to the invention a projection exposure apparatus for semiconductor lithography which includes an illumination system for illuminating a mask arranged on a movable mask stage. The apparatus also includes a projection lens for imaging the mask onto a semiconductor substrate. The apparatus also includes at least one mechanism for a t least partly decoupling at least parts of the illumination system and/or of the projection lens from the influence of pressure fluctuations in the medium surrounding the projection lens or the illumination system. The pressure fluctuations being attributed to movements of the mask stage during the operation of the apparatus. The disclosure provides advantageous embodiments and variants of the invention.

Within the meaning of the invention, a projection exposure apparatus for semiconductor lithography can comprise an illumination system for illuminating a mask arranged on a movable mask stage, and a projection lens for imaging the mask onto a wafer. In order to reduce the influence of pressure fluctuations, it is advantageously possible to use means which at least partly decouple at least parts of the illumination system and/or of the projection lens from the influence of pressure fluctuations in the medium surrounding the projection lens or the illumination system, the pressure fluctuations being attributed to movements of the mask stage during operation of the apparatus.

The projection exposure apparatus can comprise for example a means which forms a closed-off space surrounding the mask stage.

In the projection exposure apparatus, furthermore, the space surrounding the mask stage, in particular the closed-off space discussed above, can be filled with a gas whose sound absorption is higher than that of air. As a result of the reduced sound absorption, the intention is for a pressure fluctuation to propagate with reduced intensity and for the influence on the projection exposure apparatus to be kept small.

In the case of the projection exposure apparatus according to the invention, a reduced pressure compared with the surroundings can prevail in the closed-off space, with the result that the propagation of a pressure fluctuation is reduced with this means.

In the case of the projection exposure apparatus, according to the invention in particular that optical element of the illumination system and/or of the projection lens which is closest to the mask stage can also be at least partly mechanically decoupled relative to the illumination system and/or the projection lens.

In order to minimize the influence of pressure fluctuations, in the case of a projection exposure apparatus, for example, that optical element of the illumination system and/or of the projection lens which is closest to the mask stage can also be connected to the illumination system and/or the projection lens in a manipulatable manner.

In particular, a means can also be present for moving the optical element closest to the mask stage or else some other optical element of the illumination system and/or of the projection lens taking account of sound waves attributed to a movement of the mask stage.

In one advantageous projection exposure apparatus, a sound generating means can also be present which is suitable for neutralizing sound waves attributed to a movement of the mask stage at least partly for the spatial region of the projection lens.

Furthermore, a shielding can also be achieved by virtue of the fact that a pellicle, that is to say a thin, optically largely neutral membrane, is arranged between the mask stage and the illumination system and/or the projection lens. Such pellicles are usually used as shielding against contamination in semiconductor lithography apparatuses. An advantageous dual effect, namely shielding against contamination and mechanical decoupling, could thus be achieved.

In the case of a projection exposure apparatus according to the invention, the mechanism for reducing the influence of pressure fluctuations are intended in particular also to be able to be used in combination.

Figure 2:
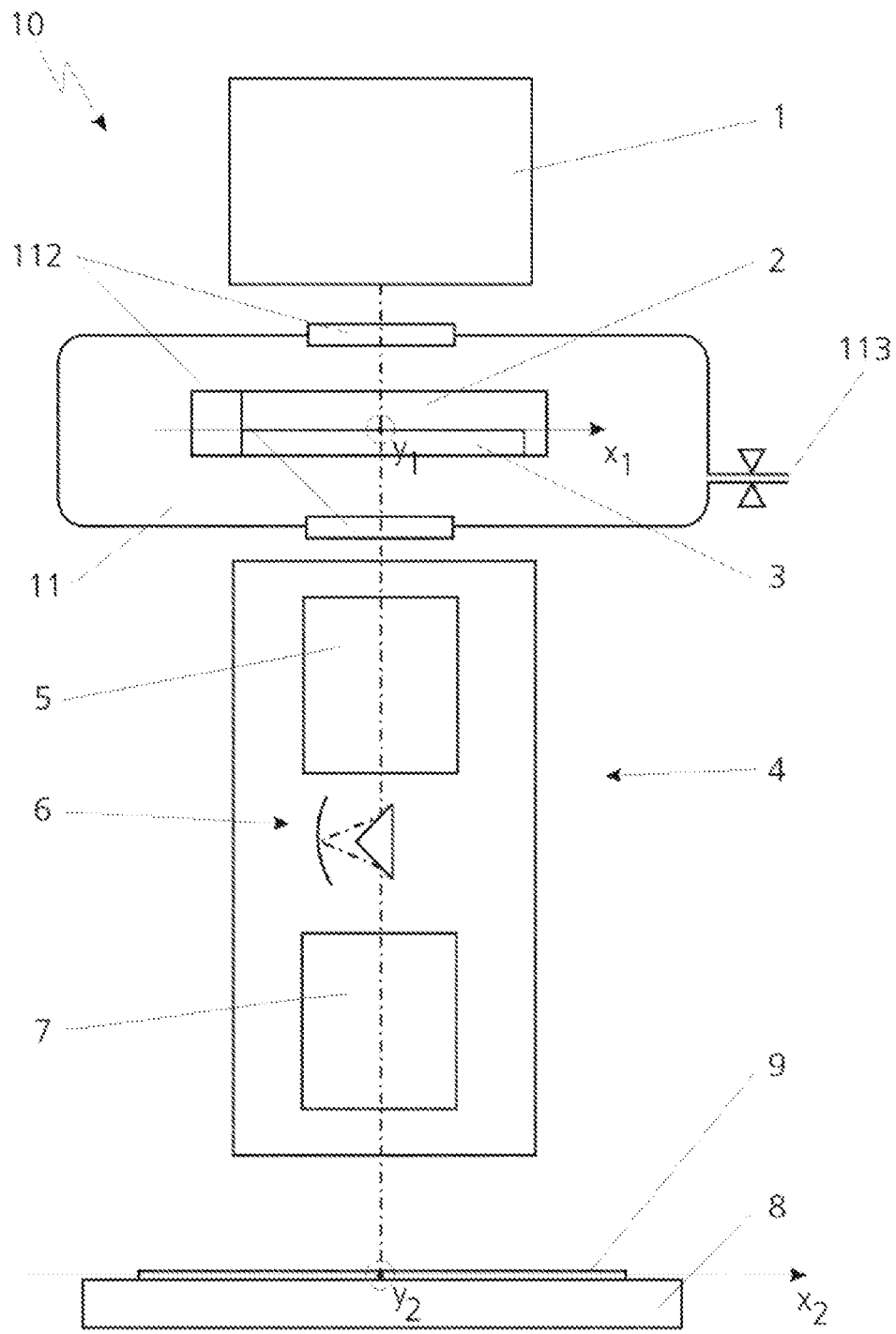
Figure 3:
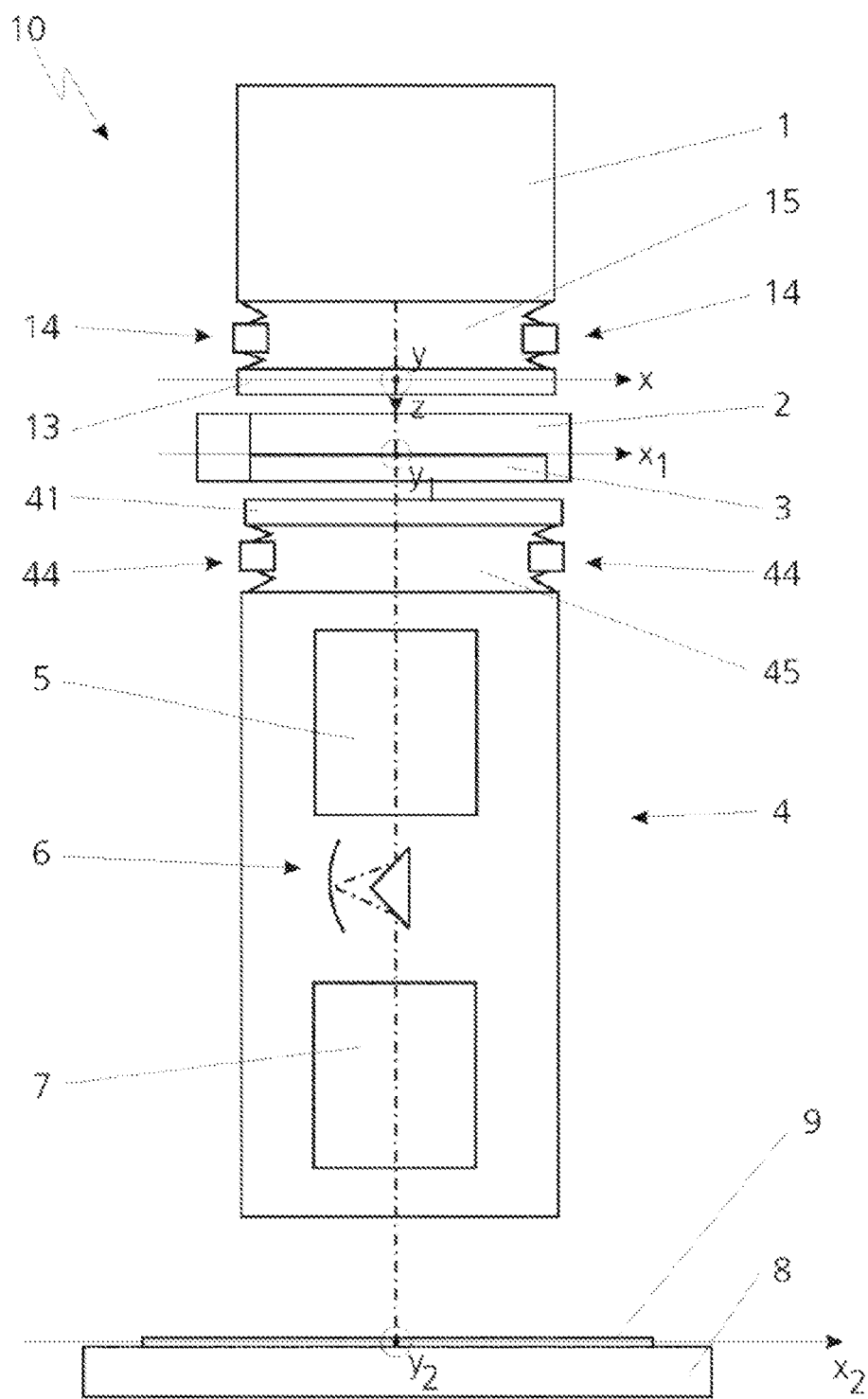
Figure 3A:
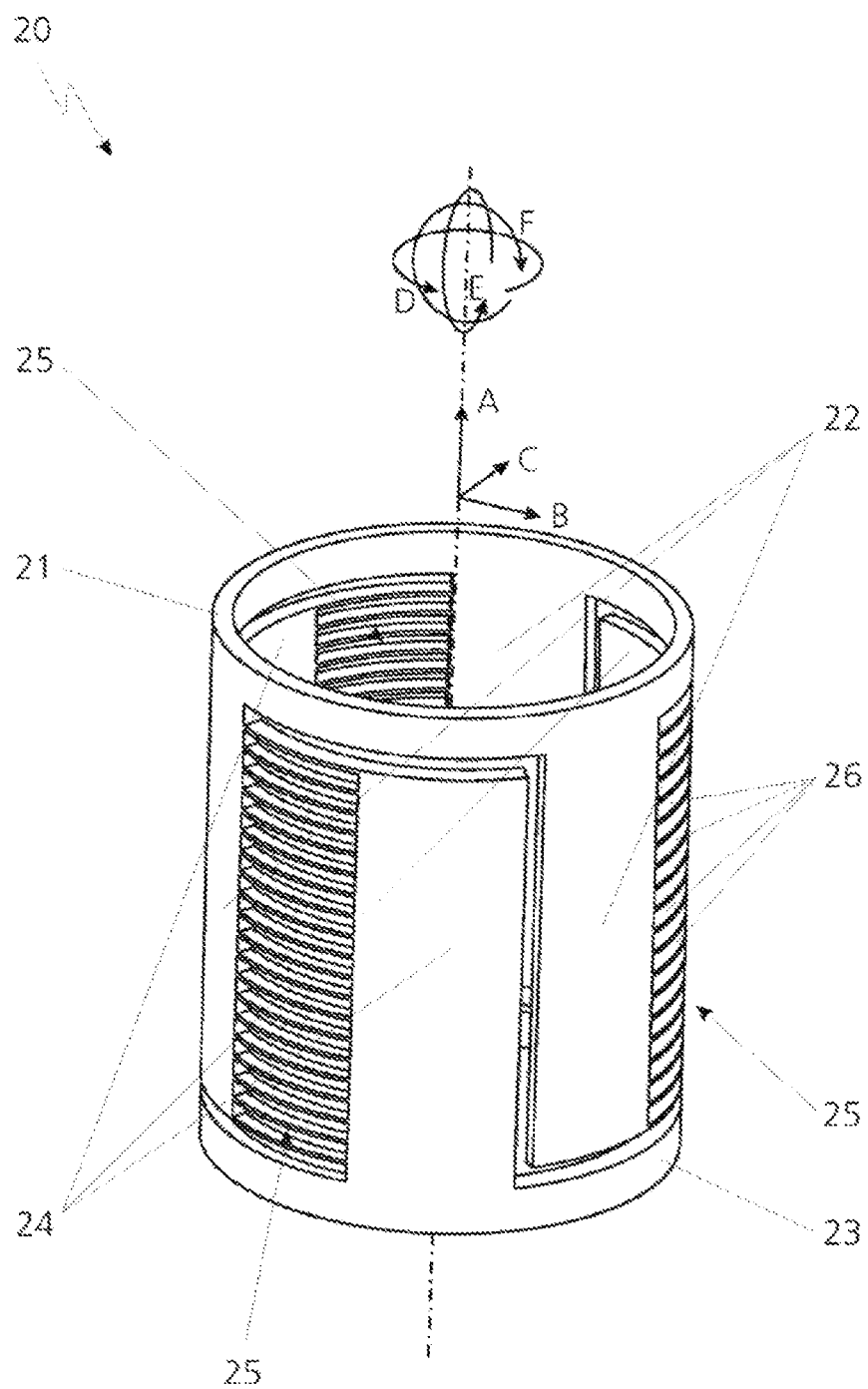
Figure 4:
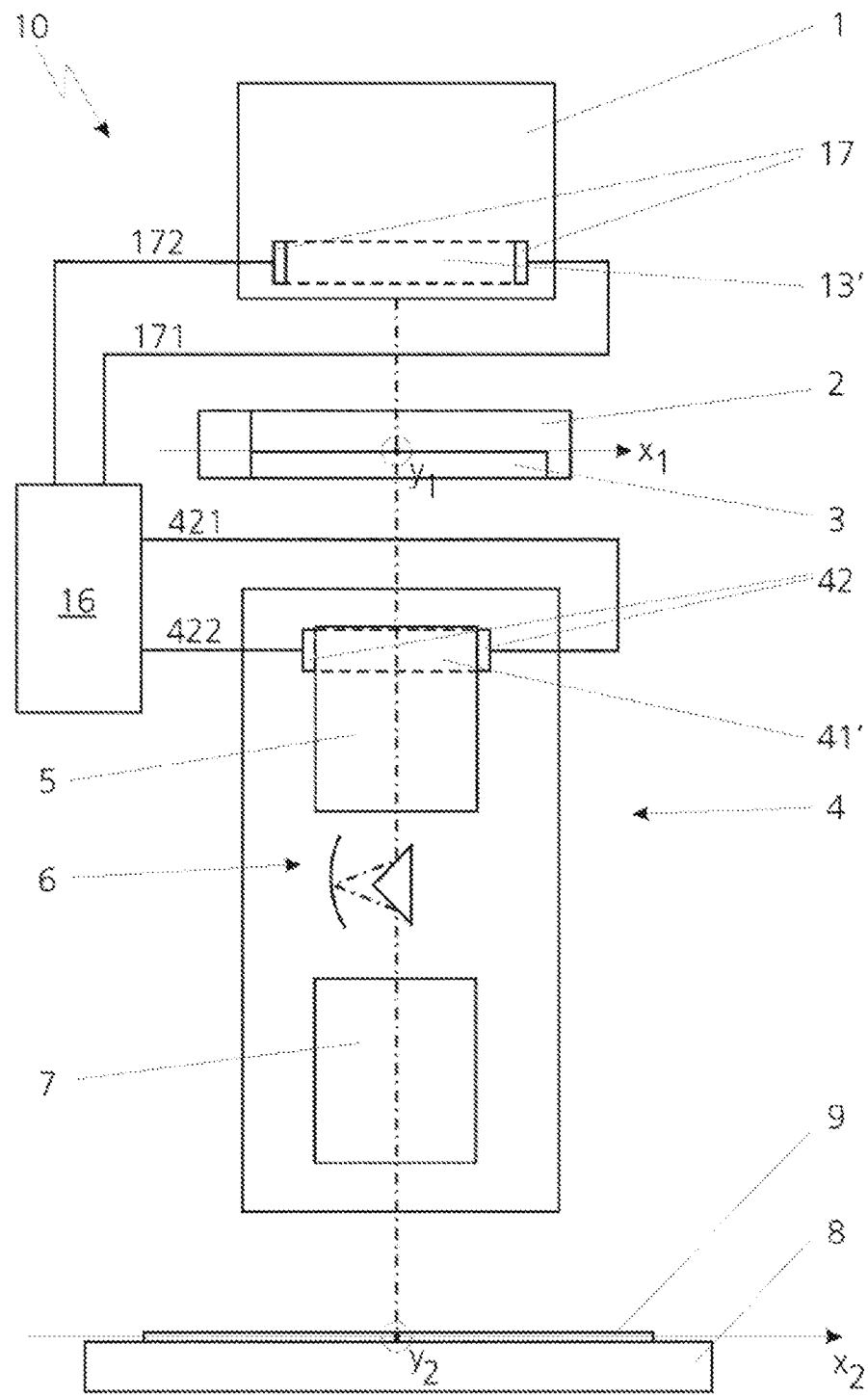
Figure 5:
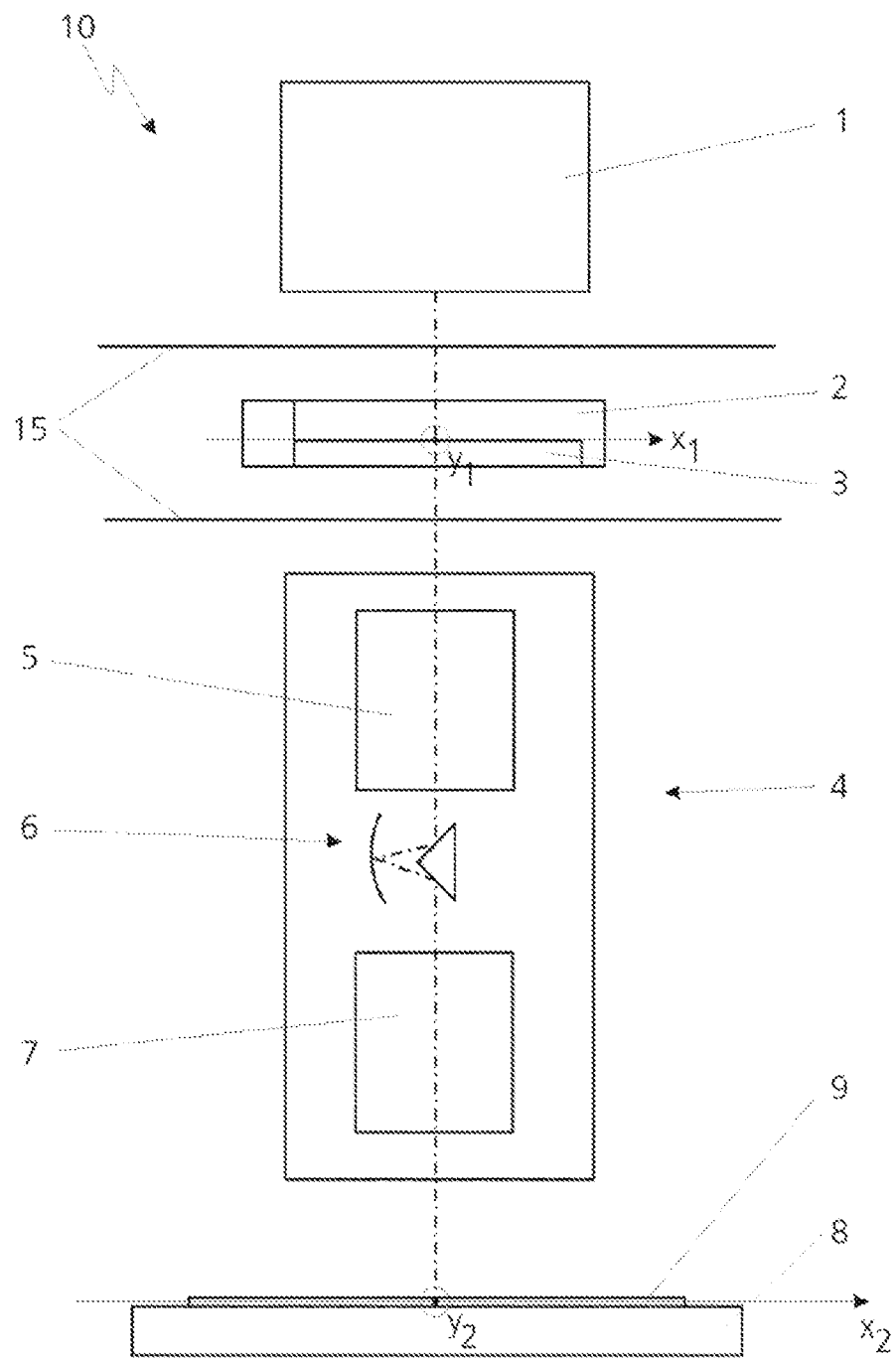
Figure 6:
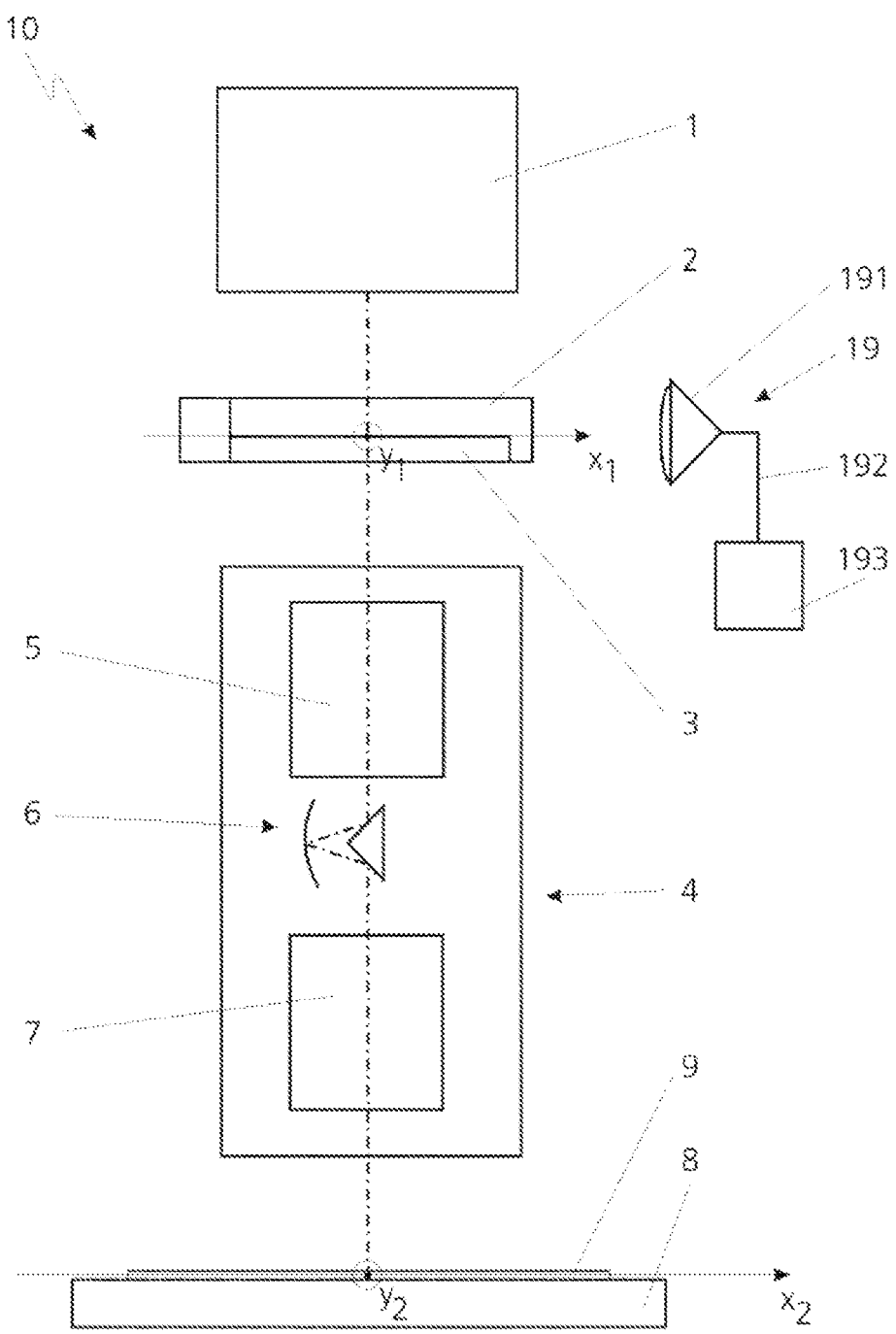

One exemplary embodiment of the invention is explained in greater detail below with reference to the drawing, in which:

FIG. 1 shows a projection exposure apparatus with a projection lens in the case of vibration excitation, FIG. 2 shows a projection exposure apparatus with an encapsulation of the mask, FIG. 3 shows a projection exposure apparatus with flexible mounting, FIG. 3a shows one possible embodiment of a flexible mounting, FIG. 4 shows a projection exposure apparatus with active manipulation, FIG. 5 shows a projection exposure apparatus with pellicles, FIG. 6 shows a projection exposure apparatus with sound source.

FIG. 1 schematically shows a projection exposure apparatus 10 according to the prior art comprising an illumination system 1, a mask stage 2 with mask 3, a projection lens 4 with three optical unit groups 5, 6 and 7, and a wafer stage 8 with semiconductor substrate 9. In this case, in so-called scan operation, the mask 3 and the semiconductor substrate 9 are moved synchronously in accordance with the optical imaging scale. The projection lens 4 illustrated here is embodied as a catadioptric system in which, as indicated in FIG. 1, a folding of the projection beam is performed by the optical unit group 6. In this case, of course, the invention is not restricted to catadioptric systems.

A vibration mode of the projection lens 4 can be excited upon the acceleration of the mask stage 2 in particular during a scanning process. In FIG. 1, the projection lens 4 is illustrated by dashed lines in the deflected position, which is depicted schematically here in a greatly exaggerated manner. This vibration excitation has the effect that the individual optical unit groups 5, 6 and 7 can likewise be deflected, the deflection of the optical unit groups 5, 6 and 7 not being indicated here in the drawing.

FIG. 2 shows a first embodiment of the invention, wherein the mask stage 2 is arranged in a closed-off space 11. The closed-off space 11 is also designated as mask encapsulation and can for example be filled with a gas or else partly or completely evacuated. The encapsulation can contain in particular aluminum, high-grade steel, such as e.g. Invar and/or ceramic.

In this case, the mask encapsulation 11 exhibits the transparent regions 112, which enable passage of the electromagnetic radiation required for the illumination of the mask 3 or for the imaging thereof. The material of the transparent regions 112 can be in particular quartz or calcium fluoride. In this case, as already mentioned, the interior of the mask encapsulation 11 can be evacuated via the gas connection 113, or else be filled with a gas exhibiting a reduced sound transmission compared with air. The gas used can be filled in the mask encapsulation 11 under atmospheric pressure or else with a certain reduced pressure. Typical pressures in the mask encapsulation 11 can be approximately half of normal atmospheric pressure, but pressures of ¹⁄₁₀ of normal atmospheric pressure or less may also be expedient.

In particular, the gas can be helium. The encapsulation of the mask stage 2 and the evacuation or the filling of the gas into the mask encapsulation 11 has the effect that movements of the mask stage 2 during the scanning process are transmitted into the surrounding medium only to a reduced extent in the form of pressure waves or pressure surges, with the result that the effect of the movements of the mask stage 2 on the surrounding or downstream components of the projection exposure apparatus 10, that is to say in particular also of the projection lens 4, is effectively reduced. In this way, it becomes possible to expose even semiconductor substrates having larger dimensions with a tenable throughput, since, as a result of the measures according to the invention, the mask stage 2 can be moved more rapidly during scanning, without the occurrence of mechanical disturbance influences on the projection lens 4 that can no longer be afforded tolerance.

FIG. 3 shows a variant of the invention in which an encapsulation of the mask stage 2 can be dispensed with. In the present example, the illumination system 1 exhibits the plane-parallel plate 13, which constitutes the optical element closest to the mask stage 2 on the illumination side. In this case, the plane-parallel plate 13 is connected to the illumination system 2 via a flexible mounting. The flexible mounting 14 is constituted in such a way as to ensure a certain mechanical decoupling of the plane-parallel plate 13 from the rest of the illumination system 1. In particular, the flexible mounting 14 allows movements of the plane-parallel plate 13 in x-, y- and z-directions, as illustrated on the basis of the arrows in FIG. 3, wherein even combined movements of the plane-parallel plate 13 in the direction of the illustrated degrees of freedom of translation are intended overall not to affect the optical imaging. Possible pressure surges or pressure waves in the surrounding medium that emanate from the moved mask stage 2 can therefore be absorbed by the plane-parallel plate 13 without any effects on the imaging quality of the system. In a similar manner, the first optical element 41 of the projection lens 4 closest to the mask stage 2 is connected to the projection lens 4 via the flexible mounting 44. In the same way as the optical element 13, the optical element 41 can be a plane-parallel plate. Here, too, the measures shown lead to a reduction of the influence of the movements of the mask stage 2 or of the pressure surges brought about by the movements on the projection lens 4. The spaces 15 and 45 arising between the optical elements 13 and 41 and respectively the illumination system 1 and the projection lens 4 can, if appropriate, be at a certain reduced pressure or be filled with a gas having higher sound absorption in comparison with air.

FIG. 3a shows one possible embodiment of the flexible mountings 14 and 44, the mounting in FIG. 3a bearing the reference sign 20. In this embodiment, there is a preferred direction A of movement, such that possible linear movements in this direction can be elastically compensated for. With this type of mounting, in particular the movements in the direction of the two linear components, which are identified here by B and C, respectively, are intended to be largely prevented. Generally, such flexible mountings 20 should have a comparatively high stiffness in the degrees of freedom of tilting, i.e. in the case of movements in accordance with the rotation axes D, E and F, respectively.

The flexible mounting 20 shown in FIG. 3a is substantially a parallel spring arrangement, having three spring zones 25 in this example. The flexible mounting 20 illustrated here exhibits a first ring 21 having three columns 22 and a second ring 23 having a further three columns 24. These columns 22 and 24 are in each case connected at one side via numerous individual spring elements 26, wherein the individual spring elements 26 are embodied here as leaf springs. This parallel spring arrangement ensures a flexible mounting with the restriction of the degrees of freedom in particular of the optical components 13 and 44.

The optical elements 13 and 41 need not necessarily be plane-parallel plates. In principle, a multiplicity of possible optical elements are conceivable; it is advantageous if relative movements of the optical elements 13 and 41 relative to the mask stage 2 and respectively to the illumination system 1 or to the projection lens 4 do not affect the quality of the imaging of the overall system. In this case, the plane-parallel plates described merely constitute one—albeit probably the simplest—possibility.

FIG. 4 shows a further embodiment of the invention, in which the optical elements 13' and 41' are connected to the illumination system 1 and the projection lens 4, respectively, via actuators 17 and 42, respectively. The actuators 17 and 42 in this case are connected to the control unit 16 via control lines 171 and 172, and 421 and 422, respectively. This variant allows the active correction of optical imaging aberrations originating from the disturbances introduced into the system by the moved mask stage 2. In this case, the mechanical vibrations or the optical imaging aberrations that can be introduced into the overall system in the uncorrected state as a result of the movements of the mask stage 2 are firstly detected metrologically, for example. A correction scenario is subsequently drawn up on the basis of the detected data and is stored for the respective operating mode of the projection exposure apparatus 10 in the control unit 16. Furthermore, it is intended to be possible, in particular, for data or results of a numerical simulation also to be used as basis for the design of the correction scenario. In other words, the disturbances originating from the mask stage 2 or the movement thereof can for example firstly be tolerated, but then corrected by active measures, namely the driving of the actuators 17 and 42, respectively. In this case, the optical elements 13' and 41' serving for correcting the movement-induced aberrations mentioned need not necessarily be embodied as optical elements closest to the mask stage 2; and arrangement elsewhere in the associated systems 1, 2 and 4 is also conceivable. However, the arrangement of the optical elements 13' and 41' shown affords the advantage that the solution shown in FIG. 4 can be retrofitted comparatively simply in a system that is in operation. In addition, with regard to both FIGS. 3 and 4 it should be noted that not necessarily both systems, that is to say the illumination system 1 and the projection lens 4, need to be provided with the optical elements described above. It is likewise conceivable for only the illumination system 1 or else only the projection lens 4 to be equipped correspondingly. The actuators 17 and/or 42 can be piezo actuators, in particular.

FIG. 5 shows a variant of the invention in which pellicles 15 are used. In the variant shown in FIG. 5, a pellicle 15 is arranged both above and below the mask stage 2. The pellicles have a thickness in the region of 0.1 mm and are thus optically practically neutral on account of their high transmissivity to the electromagnetic radiation used, but effectively shield against the disturbing pressure surges. Cellulose nitrate can advantageously be used as material for the pellicles.

FIG. 6 shows an embodiment of the invention in which design measures on the subsystems illumination system 1, mask stage 2 or projection lens 4 can be dispensed with. In the present example, the pressure surges or pressure waves emitted as a result of the movement of the mask stage 2 are neutralized via a sound generating unit 19 in the vicinity of the mask stage 2. In this case, the sound source 191 is connected to the control unit 193 via the control line 192 and generates, in a manner adapted to the respective operating mode of the projection exposure apparatus 10 and the associated movements of the mask stage 2, pressure surges or pressure waves which neutralize the disturbances emanating from the mask stage 2 at least in the relatively close vicinity. For this purpose, in the control unit 193, a corresponding sound pattern for a respective use scenario can already be stored in the form of a database; alternatively or additionally, an initial calibration of the system with regard to maximum sound suppression in the region of the projection exposure apparatus can also be performed via one or a plurality of sound pressure sensors in the region of the mask stage 2 (not illustrated). At the same time or in addition, it is also conceivable, via image aberration measurements in the substrate plane (for example via a wavefront sensor), to adjust the sound generating unit 19 when starting in a new operating mode in such a way that the image aberrations originating from the movement of the mask stage 2 are as far as possible reduced.

The invention claimed is:

1. An apparatus, comprising:
   an illumination system configured to illuminate a first object;
   a stage configured to move the first object;
   a projection lens configured to image the first object onto a second object; and
   a mechanism comprising:
      a closed-off space surrounding the stage; and
      a unit configured to generate sound so that, during use of the apparatus, the unit at least partially neutralizes sound waves in a spatial region of the projection lens, the sound waves being due to movement of the stage,
   wherein:

the unit comprises a control unit storing a database that sound pattern data;

during use of the apparatus, the stored sound pattern data in the control unit are used by the unit to generate the sound waves in the spatial region of the projection lens;

during use of the apparatus, movement of the stage causes pressure fluctuations in a medium surrounding a portion of the apparatus;

the portion of the apparatus comprises at least one member selected from the group consisting of the illumination system and the projection lens;

the apparatus comprises an optical element that is closest to the stage;

the optical element is in a member selected from the group consisting of the illumination system and the projection lens;

the apparatus is configured so that, during use of the apparatus, a pressure in the closed-off space is less than a pressure of the surroundings; and the apparatus is a semiconductor lithography projection exposure apparatus.

2. The apparatus of claim 1, wherein the first object comprises a mask.

3. The apparatus of claim 2, wherein the second object comprises a semiconductor substrate.

4. The apparatus of claim 3, further comprising a gas in the closed-off space of the stage, wherein a sound absorption of the gas is greater than a sound absorption air.

5. The apparatus of claim 3, wherein the mechanism comprises a pellicle between the stage and the projection lens.

6. The apparatus of claim 4, wherein the portion of the apparatus comprises the illumination system.

7. The apparatus of claim 4, wherein the portion of the apparatus comprises the projection lens.

8. The apparatus of claim 4, wherein the gas fills the closed-off space of the stage.

9. The apparatus of claim 4, wherein the illumination system comprises an optical component which is the optical element of the illumination system that is closest to the stage, and the optical element is at least partially mechanically decoupled from the illumination system.

10. The apparatus of claim 9, wherein the mechanism comprises a parallel spring mechanism configured to at least partially mechanically decouple the optical element from the illumination system.

11. The apparatus of claim 4, wherein the projection lens comprises an optical component which is the optical element of the projection lens that is closest to the stage, and the optical element is at least partially mechanically decoupled from the projection lens.

12. The apparatus of claim 4, wherein the mechanism comprises a parallel spring mechanism configured to at least partially mechanically decouple the optical element from the projection lens.

13. The apparatus of claim 4, wherein:
the illumination system comprises a first optical element which is the optical element of the illumination system which is closest to the stage;
the first optical element is at least partially decoupled from the illumination system;
the projection lens comprises a second optical element which is the optical element of the projection lens which is closest to the stage; and
the second optical element is at least partially decoupled from the projection lens.

14. The apparatus of claim 13, wherein the mechanism comprises:
a first parallel spring mechanism configured to at least partially mechanically decouple the first optical element from the illumination system; and
a second parallel spring mechanism configured to at least partially mechanically decouple the second optical element from the projection lens.

15. The apparatus of claim 4, wherein the illumination system comprises a manipulable optical element.

16. The apparatus of claim 15, wherein the manipulable optical element is the optical element of the illumination system that is closest to the stage.

17. The apparatus of claim 15, wherein the mechanism is configured so that, during use of the apparatus, the second mechanism moves the manipulable optical element based on sounds waves due to movement of the stage.

18. The apparatus of claim 4, wherein the projection lens comprises a manipulable optical element.

19. The apparatus of claim 18, wherein the manipulable optical element is the optical element of the illumination system that is closest to the stage.

20. The apparatus of claim 18, wherein the mechanism is configured so that, during use of the apparatus, the second mechanism moves the manipulable optical element based on sounds waves due to movement of the stage.

21. The apparatus of claim 4, wherein the mechanism comprises a pellicle between the stage and the illumination system.

22. The apparatus of claim 4, wherein the optical element is movable relative to the member via mechanical decoupling.

23. The apparatus of claim 4, wherein the optical element is movable relative to the member via actuation via at least one actuator.

24. The apparatus of claim 4, wherein the mechanism is configured so that, during use of the apparatus, the mechanism at least partially decouples at least part of the portion of the apparatus from an influence of the pressure fluctuations in the medium surrounding the portion of the apparatus.

25. The apparatus of claim 4, further comprising an encapsulation defining the closed-off space surrounding the stage.

26. The apparatus of claim 25, wherein one of the following holds:
the encapsulation comprises at least one transparent region configured to allow the passage of electromagnetic radiation used to illuminate the first object; and
the encapsulation comprises at least one transparent region configured to image the first object onto the second object.

27. The apparatus of claim 4, wherein:
the unit comprises:
pressure sensors configured to measure the sound waves due to movement of the stage; and
a sound generating unit;
the control unit is configured to receive a first signal from the pressure sensors;
the first signal is based on the sound waves measured by the pressure sensors;
the control unit is configured to send a second signal to the sound generating unit;
the second signal is based on the first signal; and
using the stored sound pattern data in the control unit, the sound generating unit is configured to generate the sound based on the second signal.

28. A method using an apparatus comprising an illumination system, a projection lens, and a stage configured to move a mask, the method comprising:
   using the illumination system to at least partially illuminate the mask; and
   using the projection system to project at least a portion of the illuminated mask onto a semiconductor substrate, wherein:
      the method further comprises:
         moving the mask and a portion of the stage that supports the mask; and
         using sound pattern data stored in a control unit of the apparatus, generating sound to at least partially neutralize sound waves due to movement of the stage;
      a mechanism comprises a closed-off space surrounding the stage; and
      during movement of the portion of the stage that supports the mask, a pressure in the closed-off space is less than a pressure of the surroundings.

29. The method of claim 28, further comprising at least partially decoupling at least part of the portion of the stage that supports the mask from an influence of pressure fluctuations in a medium surrounding the portion of the stage that supports the mask.

30. The method of claim 29, wherein the portion of the stage that supports the mask comprises at least one member selected from the group consisting of the illumination system and the projection lens.

31. The method of claim 28, further comprising:
   using pressure sensors to measure the sound waves due to movement of the stage; and
   generating the sound based on the sound waves measured by the pressure sensors.

* * * * *